United States Patent
Hsiao et al.

(10) Patent No.: US 10,594,143 B2
(45) Date of Patent: Mar. 17, 2020

(54) CHARGING METHOD FOR BATTERY SET AND BATTERY MANAGEMENT SYSTEM USING THE SAME

(71) Applicant: NATIONAL CHUNG SHAN INSTITUTE OF SCIENCE AND TECHNOLOGY, Taoyuan (TW)

(72) Inventors: Wei-Min Hsiao, Taoyuan (TW); Jeng-Chyan Lin, Taichung (TW); Kuo-Kuang Jen, Taoyuan (TW); Fu-Min Fang, Taoyuan (TW)

(73) Assignee: NATIONAL CHUNG SHAN INSTITUTE OF SCIENCE AND TECHNOLOGY (TW)

( * ) Notice: Subject to any disclaimer, the term of this patent is extended or adjusted under 35 U.S.C. 154(b) by 232 days.

(21) Appl. No.: 15/837,114

(22) Filed: Dec. 11, 2017

(65) Prior Publication Data

US 2019/0181654 A1   Jun. 13, 2019

(51) Int. Cl.
*H02J 7/00* (2006.01)
*H02J 7/04* (2006.01)
*G01R 31/36* (2020.01)

(52) U.S. Cl.
CPC ............ *H02J 7/0014* (2013.01); *G01R 31/36* (2013.01); *H02J 7/0019* (2013.01); *H02J 7/045* (2013.01); *H02J 7/0026* (2013.01)

(58) Field of Classification Search
CPC ........................................................ H02J 7/00
See application file for complete search history.

(56) References Cited

U.S. PATENT DOCUMENTS

2011/0234170 A1*   9/2011   Zhang ................... H02J 7/0016
                                                          320/134

* cited by examiner

*Primary Examiner* — Robert Grant
(74) *Attorney, Agent, or Firm* — Schmeiser, Olsen & Watts, LLP (57) ABSTRACT

A charging method for a battery set with a plurality of battery cells, having steps of performing a serial charging on the battery cells; determining whether one of the battery cells reaches a saturation voltage; and performing a uniform separately charging on the battery cells when one of the battery cells reaches the saturation voltage, wherein the uniform separately charging comprises sorting the battery cells according to cell voltages of the battery cells; and sequentially and separately charging the sorted battery cells to a $N^{th}$ segmented voltage in a $N^{th}$ segmentation, wherein N is a positive integer from 1 to K, and K is a positive integer larger than 1. The charging method of the present disclosure can reduce the temperature rising of the battery cell due to the longtime charging.

18 Claims, 9 Drawing Sheets

CHARGING METHOD FOR BATTERY SET AND BATTERY MANAGEMENT SYSTEM USING THE SAME

FIELD OF THE INVENTION

The present disclosure relates to a charging method for a battery set and a battery management system using the same, and in particular to the charging method which balances the battery cells of the battery set, and charges the battery cells in multiple segmentations.

BACKGROUND OF THE INVENTION

The secondary battery technology has been developed well, and thus the electric vehicle and the electronic hand-held or mobile device can use the battery sets which can be charged by an external power source. In the conventional two stage charging method, the battery cells can be serially charged in a first stage (i.e. first stage charging). In such scheme, the battery cells are connected in a serial fashion, and a positive terminal of the first battery cell and a negative terminal of the last battery cell are respectively connected to an anode terminal and a cathode of the external power source, so as to perform the first stage charging.

After the first stage charging has been finished, a second stage charging is performed for separately charging the battery cells. In the second stage charging, a battery cell with a minimum cell voltage among the battery cells is selected to be charged to a saturation voltage. After the selected battery cell is charged to the saturation voltage, other one battery cell with the minimum cell voltage among the battery cells is selected to be charged to the saturation voltage. That is, all battery cells are charged to the saturation voltage in separate time period.

However, if the battery cell is charged long, a temperature value of the battery cell will increase. Due to chemical reaction and a current passing through an internal resistor of the battery cell, thermal energy is generated. In short, the temperature value of the battery cell increases when the battery cell is charged, and the battery cell may be damaged (i.e. lifetime may be decreased) if the battery cell is charged too long. Moreover, in the conventional two stage charging method, balancing for the battery cells is performed after all battery cells have been completely charged.

SUMMARY OF THE INVENTION

An objective of the present disclosure is to provide a charging method for a battery set comprising a plurality of battery cells, and the charging method shortens each time period for separately charging the battery cells, such temperature value of the battery cells will increase little. Furthermore, each battery cell is separately and uniformly charged in a plurality of segmentations, and finally each battery cell is charged to a saturation voltage but not overcharged.

To achieve at least the above objective, the present disclosure provides a charging method for a battery set with a plurality of battery cells, comprising: performing a serial charging on the battery cells; determining whether one of the battery cells reaches a saturation voltage; and performing a uniform separate charging on the battery cells when one of the battery cells reaches the saturation voltage, wherein the uniform separate charging comprises: sorting the battery cells according to cell voltages of the battery cells; and sequentially and separately charging the sorted battery cells to a $N^{th}$ segmented voltage in a $N^{th}$ segmentation, wherein N is a positive integer from 1 to K, and K is a positive integer larger than 1.

To achieve at least the above objective, the present disclosure provides a battery management system for charging a battery set with a plurality of battery cells comprising: a controller, a balancing power source and switching modules; wherein the controller, the balancing power source and the switching modules cooperate to perform the above charging method.

In an embodiment of the present disclosure, the uniform separate charging is finished when the sorted battery cells are sequentially and separately charged to the $K^{th}$ segmented voltage in the $K^{th}$ segmentation In an embodiment of the present disclosure, the battery cell with a minimum cell voltage is firstly charged to the $N^{th}$ segmented voltage in the $N^{th}$ segmentation, then the battery cell with a sub minimum cell voltage is charged to the $N^{th}$ segmented voltage in the $N^{th}$ segmentation, and then, in this manner, the next battery cell with the cell voltage less than the $N^{th}$ segmented voltage is charged to the Nth segmented voltage in the $N^{th}$ segmentation.

In an embodiment of the present disclosure, the charging method further comprises: measuring a voltage difference between a maximum cell voltage and a minimum cell voltage among the battery cells; and performing balancing of the serial charging when no battery cells reach the saturation voltage, wherein the balancing of the serial charging comprises: separately charging the battery cell with the minimum cell voltage when the voltage difference is larger than a first threshold voltage, and stop separately charging when the voltage difference is reduced to less than a second threshold voltage, wherein the first threshold voltage is larger than the second threshold voltage.

In an embodiment of the present disclosure, the first threshold voltage and the second threshold voltage are 50 and 30 mini volts.

In an embodiment of the present disclosure, when the voltage difference is larger than the first threshold voltage and the minimum cell voltage is larger than a balancing set value, the battery cell with the minimum cell voltage is separately charged.

In an embodiment of the present disclosure, balancing switches corresponding to the battery cell with the minimum cell voltage are turned on for separately charging.

In an embodiment of the present disclosure, the battery cells are lithium iron phosphate (LFP) battery cells, K is 4, and the first through fourth segmented voltages are 3.3, 3.4, 3.5 and 3.6 volts.

In an embodiment of the present disclosure, the battery cells are lithium ion (NMC, i.e. lithium nickel manganese cobalt oxide) battery cells, K is 4, and the first through fourth segmented voltages are 3.9, 4.0, 4.1 and 4.2 volts.

In an embodiment of the present disclosure, the serial charging comprises: connecting the battery cells in a serial fashion; and connecting a positive terminal of a first battery cell of the serially connected battery cells and a negative terminal of a last battery cell of the serially connected battery cells respectively to an anode terminal and a cathode of an external power source.

To sum up, the charging method of the present disclosure can sequentially and separately charge the sorted battery cells to a $N^{th}$ segmented voltage in a $N^{th}$ segmentation, such the time period for charging battery cell can be shorten, and the temperature rising of the battery cell cab be decreased.

DETAILED DESCRIPTION OF THE PREFERRED EMBODIMENTS

To make it easier for the examiner to understand the objects, characteristics and effects of this present disclosure, embodiments together with the attached drawings for the detailed description of the present disclosure are provided.

An embodiment of the present disclosure provides a charging method for a battery set comprises a plurality of cells, which in fact is a two-stage charging method. The first stage charging is a serial charging, wherein the battery cells are connected in a serial fashion, and a positive terminal of first the battery cell and a negative terminal of the last battery cell are respectively connected to an anode terminal and a cathode of the external power source, so as to perform the first stage charging. After the serial charging (i.e. a first stage charging) has been finished, the second stage charging will begin if one of the battery cell reaches a saturation voltage; otherwise, balancing of the serial charging is performed.

The second stage charging is a uniform separate charging, wherein the battery cells are sorted according to their cell voltage, and then the sorted battery cells are sequentially charged to a $N^{th}$ segmented voltage in a $N^{th}$ segmentation, wherein N is a positive integer larger than 0. Next, after the sorted battery cells have been separately charged to the $N^{th}$ segmented voltage, if N does not reach K, N is accumulated (i.e. N=N+1) and then the sorted battery cells are sequentially charged to the $N^{th}$ segmented voltage in the $N^{th}$ segmentation, wherein K is a positive integer larger than 1. That is, the battery cells are separately and uniformly charged in a plurality of segmentations, and finally each battery cell is charged to a saturation voltage but not overcharged.

Furthermore, the conventional charging method balances the cell voltages of the battery cells after the two-stage charging has been finished. However, if no battery cells reach the saturation voltage, the charging method according to an embodiment of the present disclosure can perform the balancing of the serial charging during the serial charging. Next, the charging method according to an embodiment of the present disclosure in fact performs the uniform separate charging on the sorted battery cells in balancing states. Then, the sorted battery cells are sequentially charged to the $N^{th}$ segmented voltage in the $N^{th}$ segmentation until reaching the $K^{th}$ segmented voltage.

Figure 1:
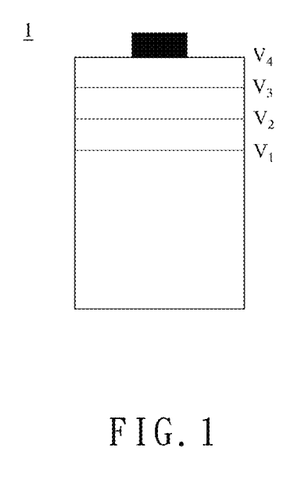
FIG. 1 is a schematic diagram showing multiple segmented voltages of a battery cell according to an embodiment of the present disclosure.

Referring to FIG. 1, FIG. 1 is a schematic diagram showing multiple segmented voltages of a battery cell according to an embodiment of the present disclosure. As mentioned above, in the second stage charging, the battery cell 1 is charged to $N^{th}$ segmented voltage $V_N$ in the $N^{th}$ segmentation, and the $K^{th}$ segmented voltage $V_K$ in fact is the saturation voltage of the battery cell 1. In this example, K is 4, and N can be 1 to 4, but the present disclosure is not limited thereto.

The battery cell 1 can be a lithium iron phosphate (LFP) battery cell, and the first through fourth segmented voltages $V_1$-$V_4$ can be 3.3, 3.4, 3.5 and 3.6 volts; or alternatively, battery cell 1 can be lithium ion (NMC) battery cell, and the first through fourth segmented voltages $V_1$-$V_4$ can be 3.9, 4.0, 4.1 and 4.2 volts. However, the present disclosure is not used to limit the type of the battery cells.

The battery set can have a plurality of the battery cells 1, for example have four battery cells 1 formed in the 4S fashion. In the first charging, the four battery cells 1 are connected in the serial fashion, and a positive terminal of the first battery cell 1 and a negative terminal of the last battery cell 1 are respectively connected to an anode terminal and a cathode of the external power source.

Before the serial charging (i.e. the first stage charging) has been finished, if no battery cells 1 reach the saturation voltage, the balancing of the serial charging is performed on the battery cells, such that a voltage difference between a minimum cell voltage and a maximum cell voltage among the battery cells 1 being larger than 50 mini volts can be reduced to less than 30 mini volts by separately charging the battery cell 1 with the minimum cell voltage.

After the balancing of the serial charging has been finished, one of the battery cells 1 can reach the saturation voltage, and then the uniform separate charging (i.e. the second stage charging) begins. Assume the battery cells 1 are lithium ion (NMC) battery cells, the first through fourth segmented voltages $V_1$-$V_4$ can be 3.9, 4.0, 4.1 and 4.2 volts, and the cell voltages of the first through the fourth battery cells 1 are 4.2, 4.05, 3.7 and 3.8 respectively after the balancing of the serial charging has been finished. Thus, the sorted battery cells 1 are respectively the third, fourth, second and first battery cells 1.

The third battery cell 1 is firstly separately charged to 3.9 volts from 3.7 volts in the first segmentation, and then the fourth cell 1 is separately charged to 3.9 volts from 3.8 volts in the first segmentation. Next, the third battery cell 1 is separately charged to 4.0 volts from 3.9 volts in the second segmentation, and then the fourth cell 1 is separately charged to 4.0 volts from 3.9 volts in the second segmentation. Next, the third battery cell 1 is separately charged to 4.1 volts from 4.0 volts in the third segmentation, then the fourth cell 1 is separately charged to 4.1 volts from 4.0 volts in the third segmentation, and then the second cell 1 is separately charged to 4.1 volts from 4.05 volts in the third segmentation. Next, the third, fourth and second battery cell 1 are sequentially and separately charged to 4.2 volts from 4.1 volts in the fourth segmentation. Therefore, all of the battery cells 1 are charged to the saturation voltage of 4.2 volts in the uniform separate charging.

Figure 2:
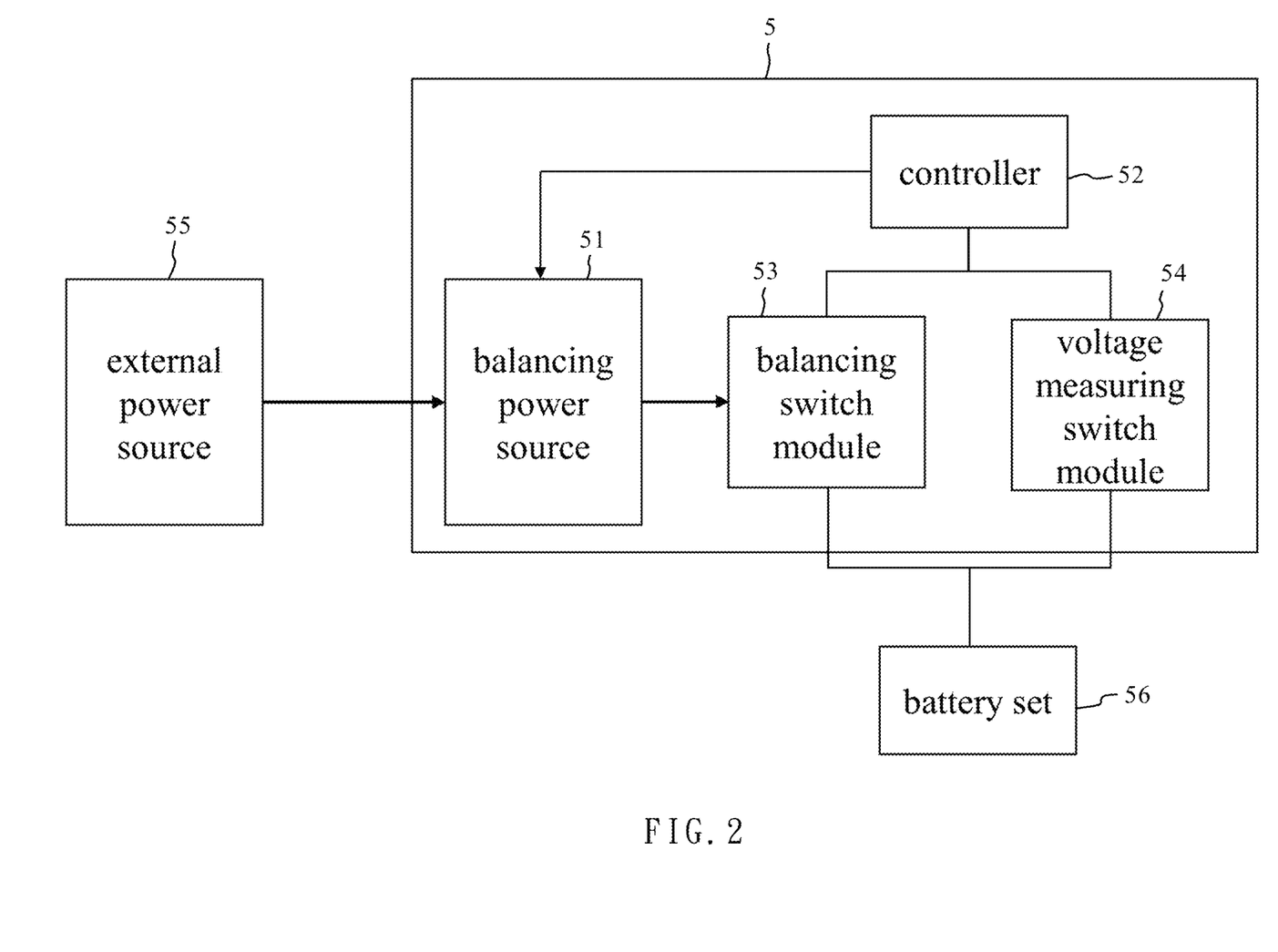
FIG. 2 is a block diagram of a battery management system according to one embodiment of the present disclosure.

Next, referring to FIG. 2, FIG. 2 is a block diagram of a battery management system according to one embodiment of the present disclosure. The battery management system 5 is implemented in a charger for charging the battery set 56 with the plurality of battery cells. The battery management system 5 receives a supplied voltage of the external power source 55, and shifts the level of the supplied voltage to generate the segmented voltages for a uniform separate charging.

The battery management system 5 comprises a balancing power source 51, a controller 52, a balancing switch module 53 and a voltage measuring switch module 54. The controller 52 is electrically connected to the balancing switch module 53 and the voltage measuring switch module 54, the balancing power source 51 is electrically connected to the controller 52, the external power source 55 and the balancing switch module 53, and the balancing switch module 53 and the voltage measuring switch module 54 are electrically connected to the battery set 56.

Figure 3:
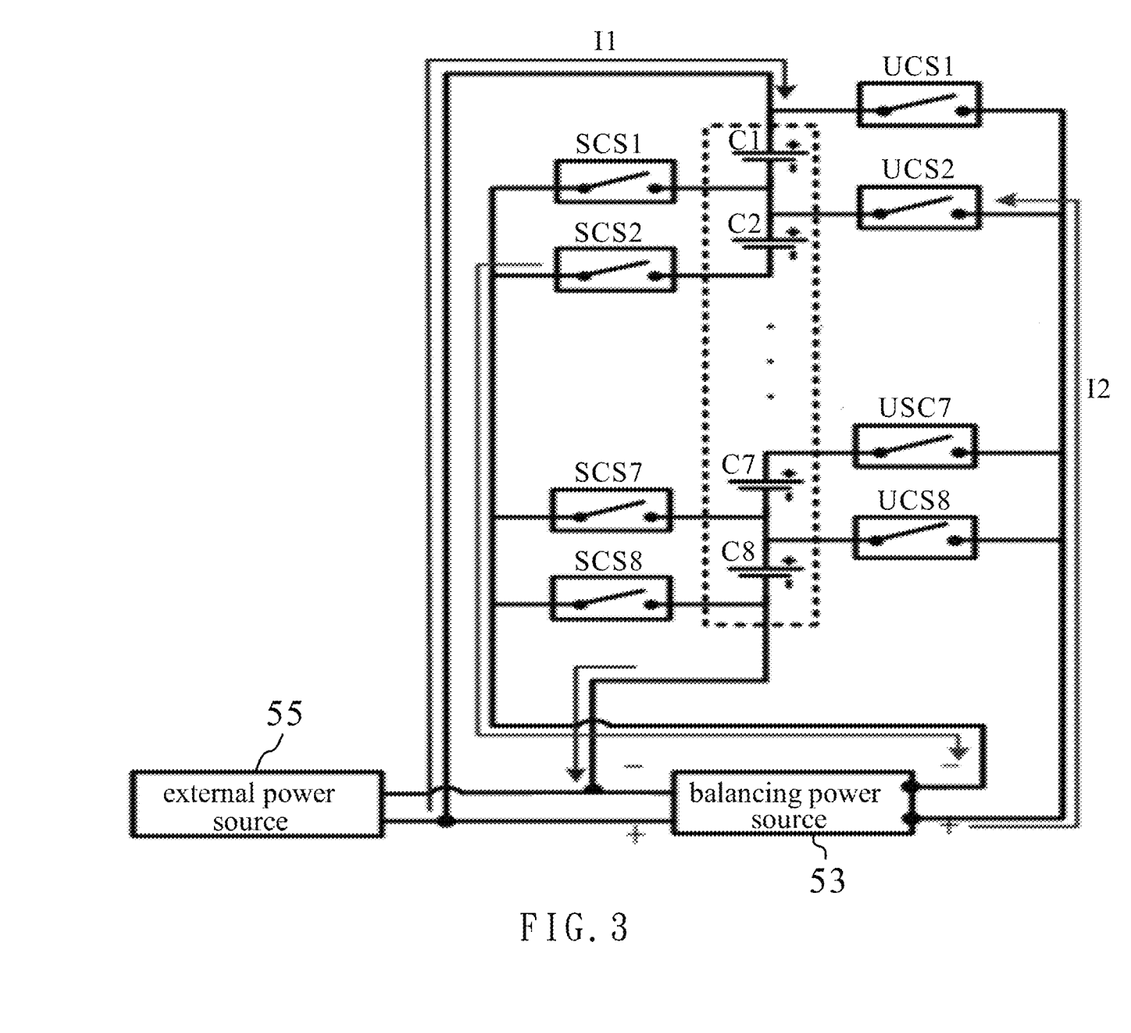
FIG. 3 is a circuit diagram of a balancing switch module according to one embodiment of the present disclosure.

Referring to FIG. 2 and FIG. 3, FIG. 3 is a circuit diagram of a balancing switch module according to one embodiment of the present disclosure. The battery set 56 has 8 battery cells C1 through C8, for example, and the balancing switch module 53 comprises 16 balancing switches SCS1 through SCS8 and UCS1 through UCS8. Each of the battery cells C1 through C8 is corresponding to and electrically connected between one pair of balancing switches, and for example, the battery cells C2 is corresponding to and electrically connected between the balancing switches SCS2 and UCS2.

The supplied voltage from the external source 55 can be used in the serial charging when all of the balancing switches SCS1 through SCS8 and UCS1 through UCS8 are turned off by the controller 52 (see current path of the current I1), and in the balancing of the serial charging when the balancing switches corresponding to the battery cell are turned on by the controller 52. The balancing power source 53 controlled by the controller 52 is a buck power source which can decrease the level of the supplied voltage to generate segmented in each segmentation. The voltage measuring switch module 54 comprises multiple voltage measuring switches electrically connected to the battery cells C1 through C8, and the voltage measuring switch corresponding to the battery cell which is measured is turned on by the controller 52 when the voltage measuring of the battery cell is performed. The controller 52 is a micro-controller-unit (MCU) being responsible for not only the control mechanism but also for the value or data calculation and the determination.

Figure 4:
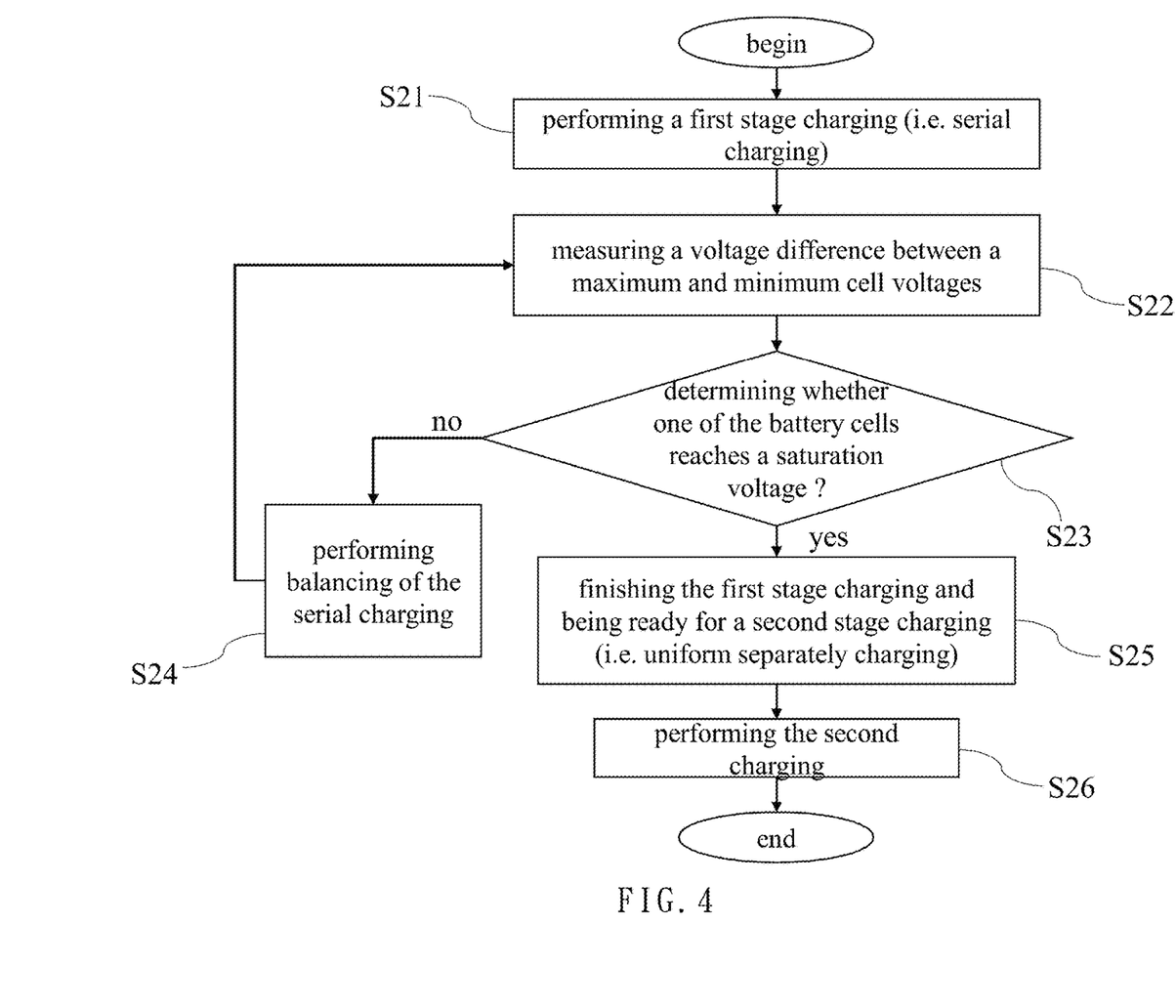
FIG. 4 is a flow chart of a charging method for a battery set according to an embodiment of the present disclosure.

Next, referring to FIG. 4, FIG. 4 is a flow chart of a charging method for a battery set according to an embodiment of the present disclosure. The charging method can be executed by a battery management system with a controller, a balancing power source and switch modules, and the present disclosure does not limit the type of the battery management system, for example the controller can be implemented by circuit components rather than the software or firmware based microcontroller.

At step S21, the battery management system performs a first stage charging (i.e. serial charging) on a plurality of battery cells included in a battery set, and the details of the serial charging has been illustrated in the above paragraphs, thus omitting the redundant descriptions (p.s. the balancing power source is disabled and all switches of the balancing and voltage measuring switch modules of the switch modules are turned off). Next, at step S22, the battery management system measures a voltage difference between a maximum cell voltage and a minimum cell voltage among the battery cells (p.s. the switch of the voltage measuring switch module corresponding the battery cell is turned on while the voltage of the battery cell is measured). Then, at step S23, the battery management system determines whether one of the battery cells reaches a saturation voltage (p.s. the determination is performed by the controller).

If one of the battery cells reaches the saturation voltage, step S25 will be executed. If no battery cells reach the saturation voltage, step S24 will be executed. Before balancing of the serial charging has been finished, no battery can reach the saturation voltage. At step S24, the controller controls balancing switches of the balancing switch module corresponding to the battery cell with the minimum cell voltage to be turned on, so as to perform the balancing of the serial charging, such that the voltage difference being larger than a first threshold voltage (such as 50 mini volts) can be reduced to less than a second threshold voltage (such as 30 mini volts), wherein the first threshold voltage is larger than the second threshold voltage, and the voltage values of the first and second threshold voltages can vary according to the type of the battery cell. The details of step S24 will be illustrated in FIG. 5, and now the details are omitted.

Figure 6:
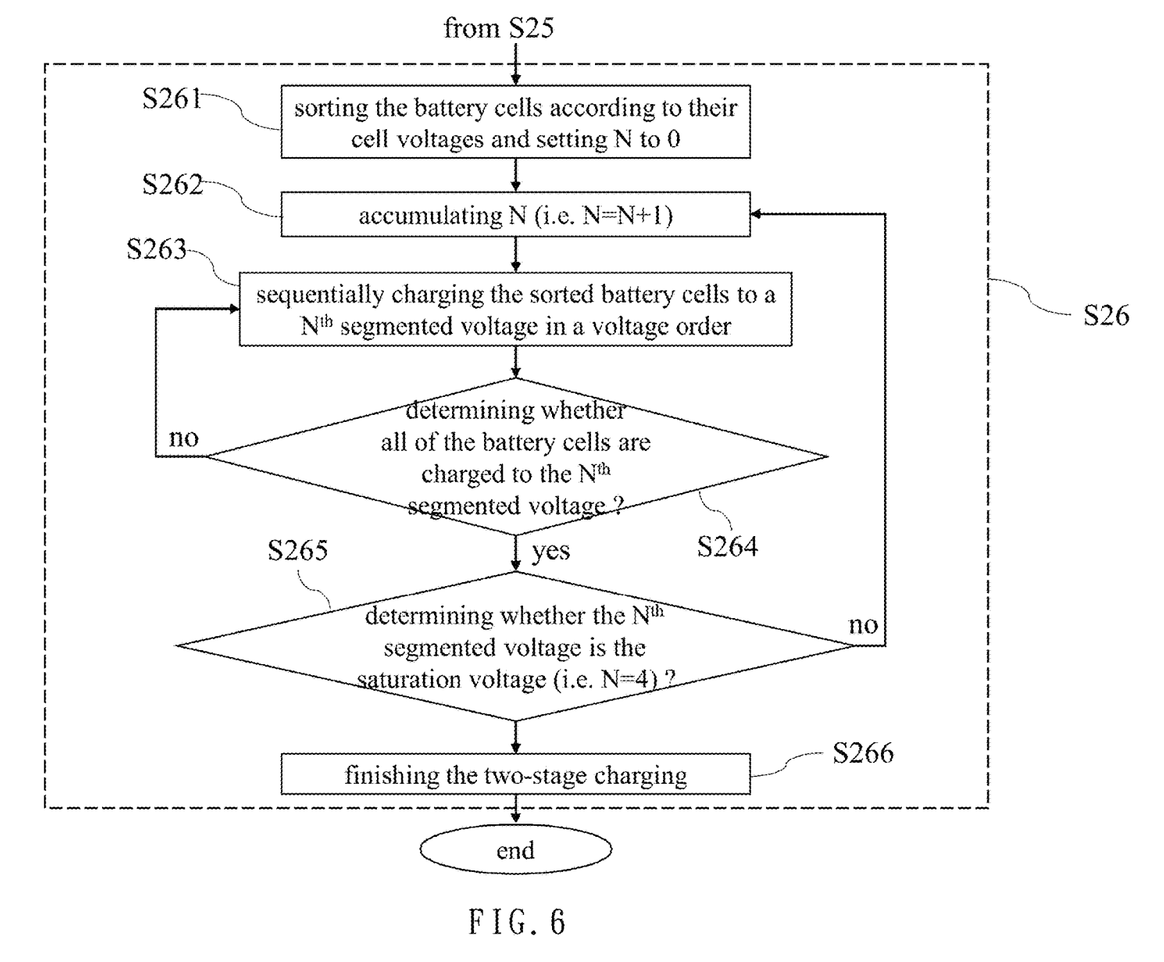
FIG. 6 is a flow chart showing a uniform separate charging according to an embodiment of the present disclosure.

After the balancing of the serial charging has been finished, one of the battery cell will reach the saturation voltage. At step S25, the controller indicates the balancing power source that the first stage charging has been finished and a second stage charging (i.e. uniform separate charging) is ready to begin (i.e. enabling the balancing power source). Next, at step S26, the controller indicates the balancing power source to perform the second stage charging on the battery cells, such that the sorted battery cells are sequentially and separately charged to a segmented voltage in each segmentation (for example, the battery cell C2 is charged to the segmented voltage when the balancing switches SCS2 and UCS2 are turned on, and the current I2 passes therethrough), and finally all battery cells are charged to the saturation voltage. Details of the step S26 are illustrated in FIG. 6, and now the details are omitted.

It is noted that since the sorted battery cells are sequentially and separately charged to a segmented voltage in each segmentation, the time period for separately charging the battery cell to the segmented voltage in one segmentation is not long, and thus it reduce the thermal energy is accumulated in the battery cell (i.e. the temperature rising of the charged battery cell is reduced and the lifetime of the battery cell is increased). Furthermore, voltage differences between battery cells can be reduced, so as to make the cell voltages of the battery cells be approximately uniform (i.e. the battery cells are balanced).

Figure 5:
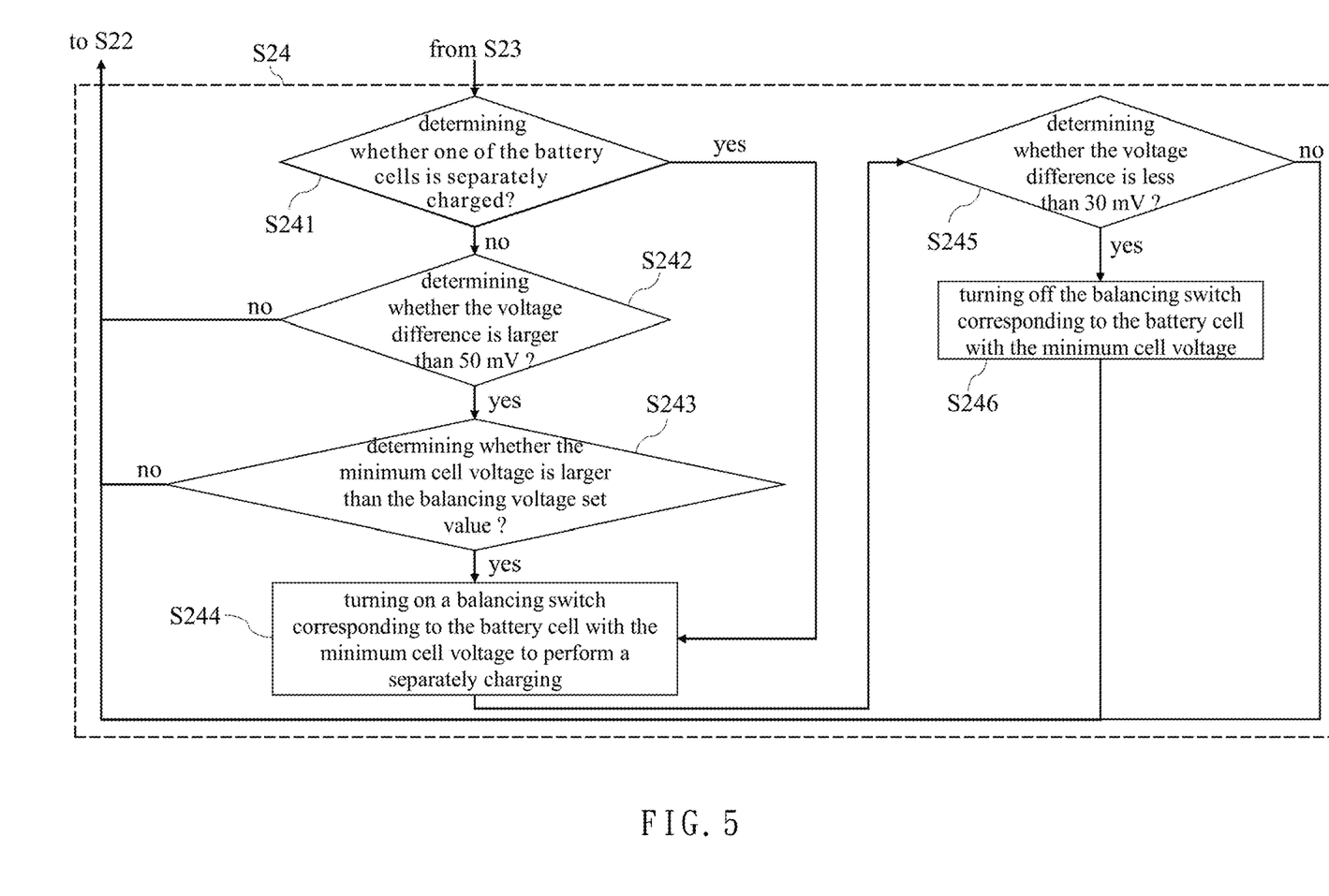
FIG. 5 is a flow chart showing balancing of the serial charging according to an embodiment of the present disclosure.

Next, referring to FIG. 5, FIG. 5 is a flow chart showing balancing of the serial charging according to an embodiment of the present disclosure. Step S24 in FIG. 4 can be implemented by the following steps S241 through S246, and the present disclosure does not limit the implementation of step S24.

At step S241, the controller determines whether one of the battery cells is separately charged. If one battery cell is separately charged for balancing of the serial charging, step S244 will be executed; otherwise, step S242 will be executed. It is noted, no battery cells are separately charged initially. Then, at step S242, the controller determines whether the voltage difference is larger than 50 mini volts (i.e. the first threshold voltage). If the voltage difference is larger than 50 mini volts, step S243 will be executed; otherwise, step S23 will be executed again.

At step S243, the controller determines whether the minimum cell voltage is larger than a balancing set value, for example, 3.3 volts when the battery cell is a lithium iron phosphate (LFP) battery cell. If the minimum cell voltage is larger than a balancing set value, step S244 will be executed; otherwise, step S23 will be executed again. That is, when the voltage difference is larger than 50 mini volts and the minimum cell voltage is larger than the balancing set value, or alternatively when one battery cell is separately charged, step S244 is executed. At step S244, the controller turns on the balancing switches corresponding to the battery cell with the minimum cell voltage and indicates the balancing power source to perform the separate charging on the battery cell with the he minimum cell voltage for balancing of the serial charging.

Next, at step S245, the controller determines whether the voltage difference is less than 30 mini volts (i.e. the second threshold voltage). If the voltage difference is less than 30 mini volts, step S246 will be executed; otherwise, step S23 will be executed again. At step S246, the controller turns off the balancing switches corresponding to the battery cell with the minimum cell voltage and indicates the balancing power source to stop the separate charging on the battery cell with the he minimum cell voltage (p.s. the balancing power source is disabled).

Accordingly, step S23 is executed at least one time until the voltage difference being larger than 50 mini volts is reduce to 30 mini volts. After the balancing of the serial balancing has been finished, one of the battery cell will reach the saturation voltage.

Next, referring to FIG. 6, FIG. 6 is a flow chart showing a uniform separate charging according to an embodiment of the present disclosure. Step S26 in FIG. 4 can be implemented by the following steps S261 through S266, and the present disclosure does not limit the implementation of step S26.

At step S261, the controller sorts the battery cells according to the cell voltages of the battery cells, and sets N to 0 initially. Next, at step S262, the controller accumulates N, i.e. N=N+1. Then, at step S263, the controller indicates the balancing power source to sequentially and separately charge the sorted battery cells to a $N^{th}$ segmented voltage in a $N^{th}$ segmentation. That is, the battery cell with the minimum voltage is charged to the $N^{th}$ segmented voltage in the $N^{th}$ segmentation, then the battery cell with the sub-minimum is charged to the $N^{th}$ segmented voltage in the $N^{th}$ segmentation, and then, in this manner, the next battery cell with the cell voltage less than the $N^{th}$ segmented voltage is charged to the $N^{th}$ segmented voltage in the $N^{th}$ segmentation.

Next, at step S264, the controller determines whether all of the battery cells are charged to the $N^{th}$ segmented voltage. If all of the battery cells are charged to the $N^{th}$ segmented voltage, step S265 will be executed; otherwise, step S263 will be executed again. At step S265, the controller determines whether the $N^{th}$ segmented voltage is the saturation voltage (i.e. whether N equals to K). If the $N^{th}$ segmented voltage is the saturation voltage, step S266 is executed; otherwise, step S262 will be executed again. At step S266, the controller indicates the balancing power source that the two-stage charging has been finished, and then the charging method is ended.

Figure 7A:
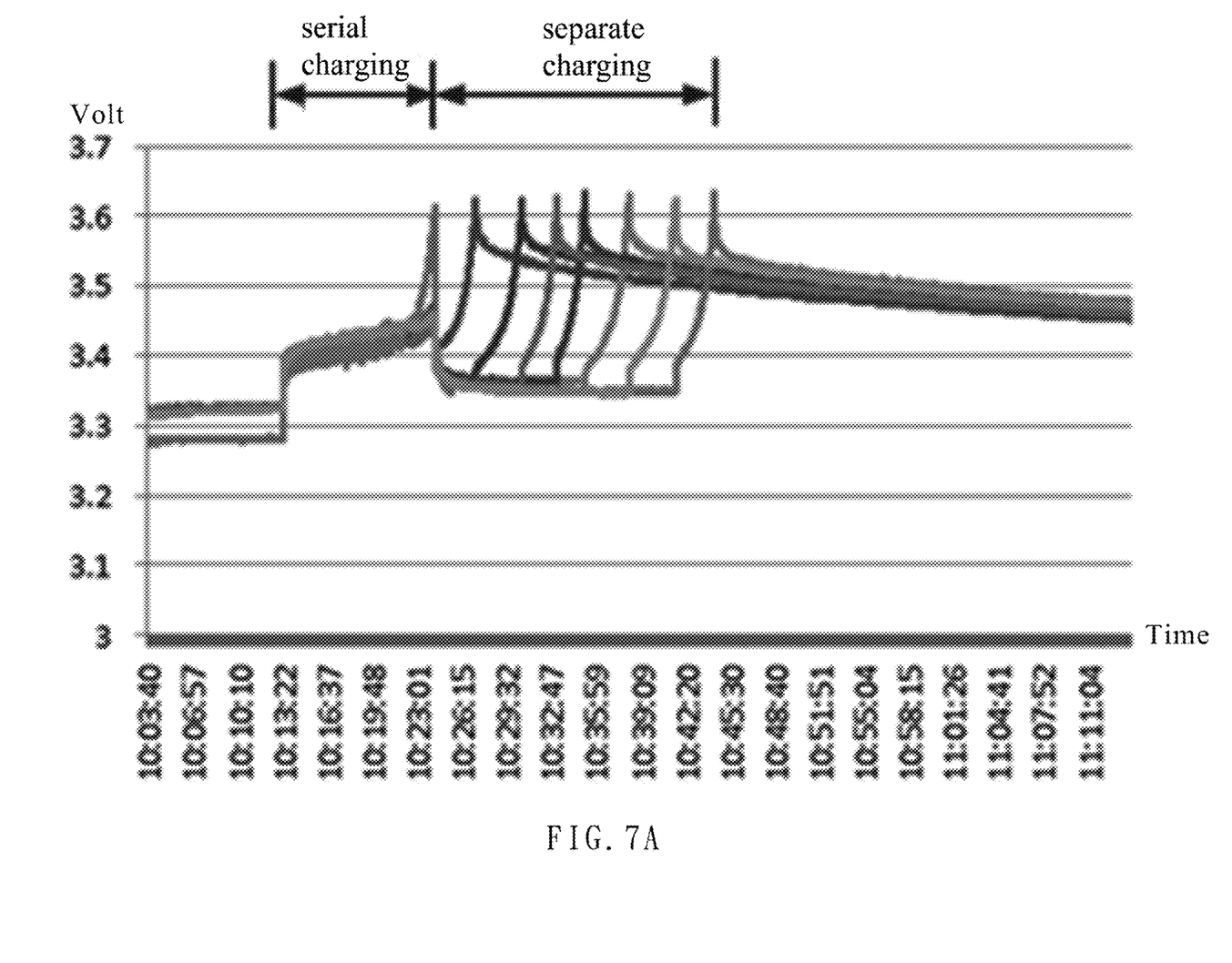
FIG. 7A is a curve diagram showing voltages of battery cells in a battery set when the conventional two stage charging method is successfully performed on the battery set.
Figure 7B:
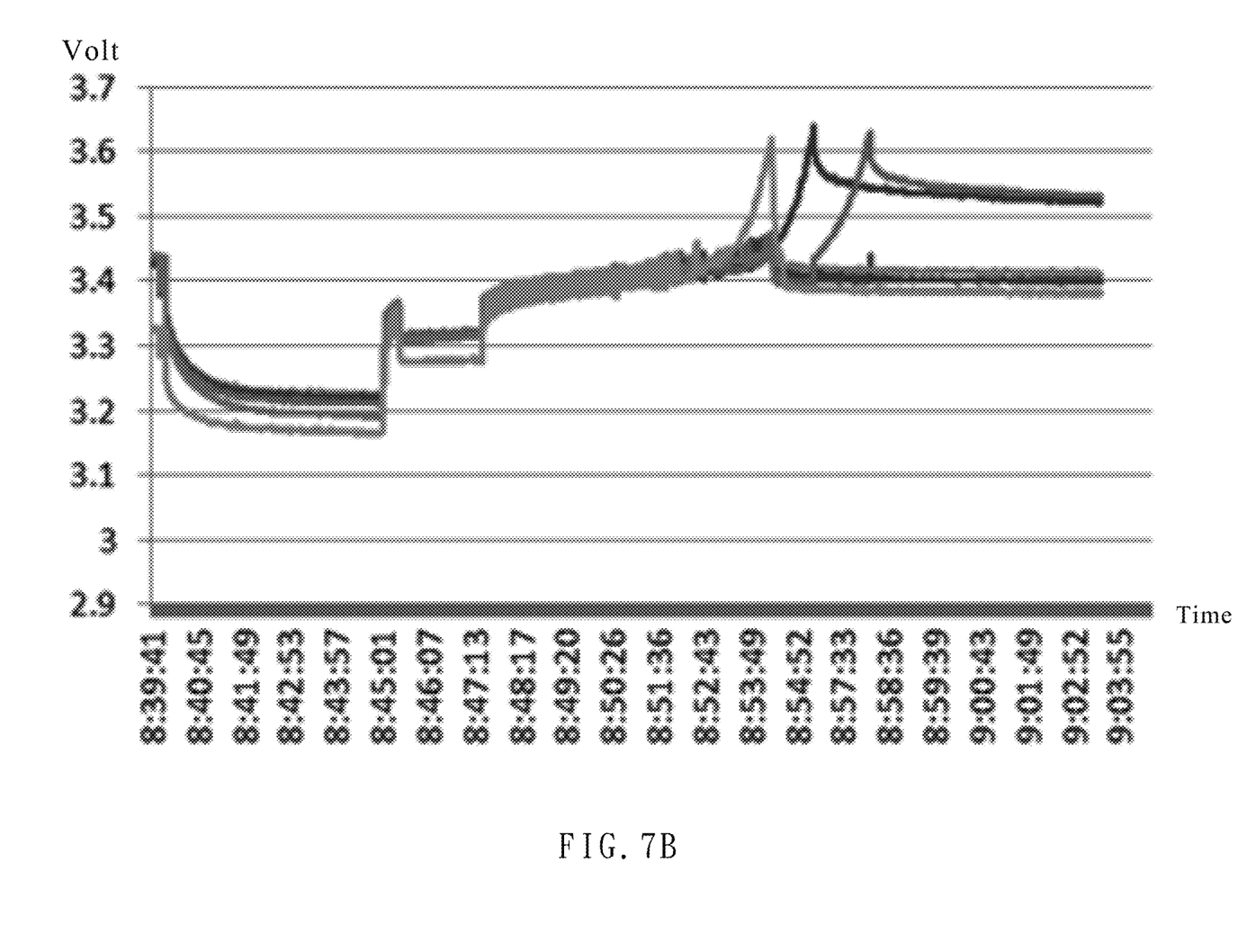
FIG. 7B is a curve diagram showing voltages of battery cells in a battery set when the conventional two stage charging method is not successfully performed on the battery set.

Referring to FIG. 7A and FIG. 7B, FIG. 7A is a curve diagram showing voltages of battery cells in a battery set when the conventional two stage charging method is successfully performed on the battery set, and FIG. 7B is a curve diagram showing voltages of battery cells in a battery set when the conventional two stage charging method is not successfully performed on the battery set. The conventional two stage charging method should firstly perform the serial charging on the all battery cells, and then perform the separate charging on the battery cells sequentially. The conventional two stage charging method is successfully performed when the all battery cells are charged to the saturation voltage. However, the conventional two stage charging method costs much time as shown in FIG. 7A. If the battery set should be used in the emergency condition, the conventional two stage charging method will not be successfully performed, and the voltage difference between the successfully separately charge battery cell and the non-successfully separately charge battery cell is large, as shown in FIG. 7B, such as about 0.11 volts.

Figure 7C:
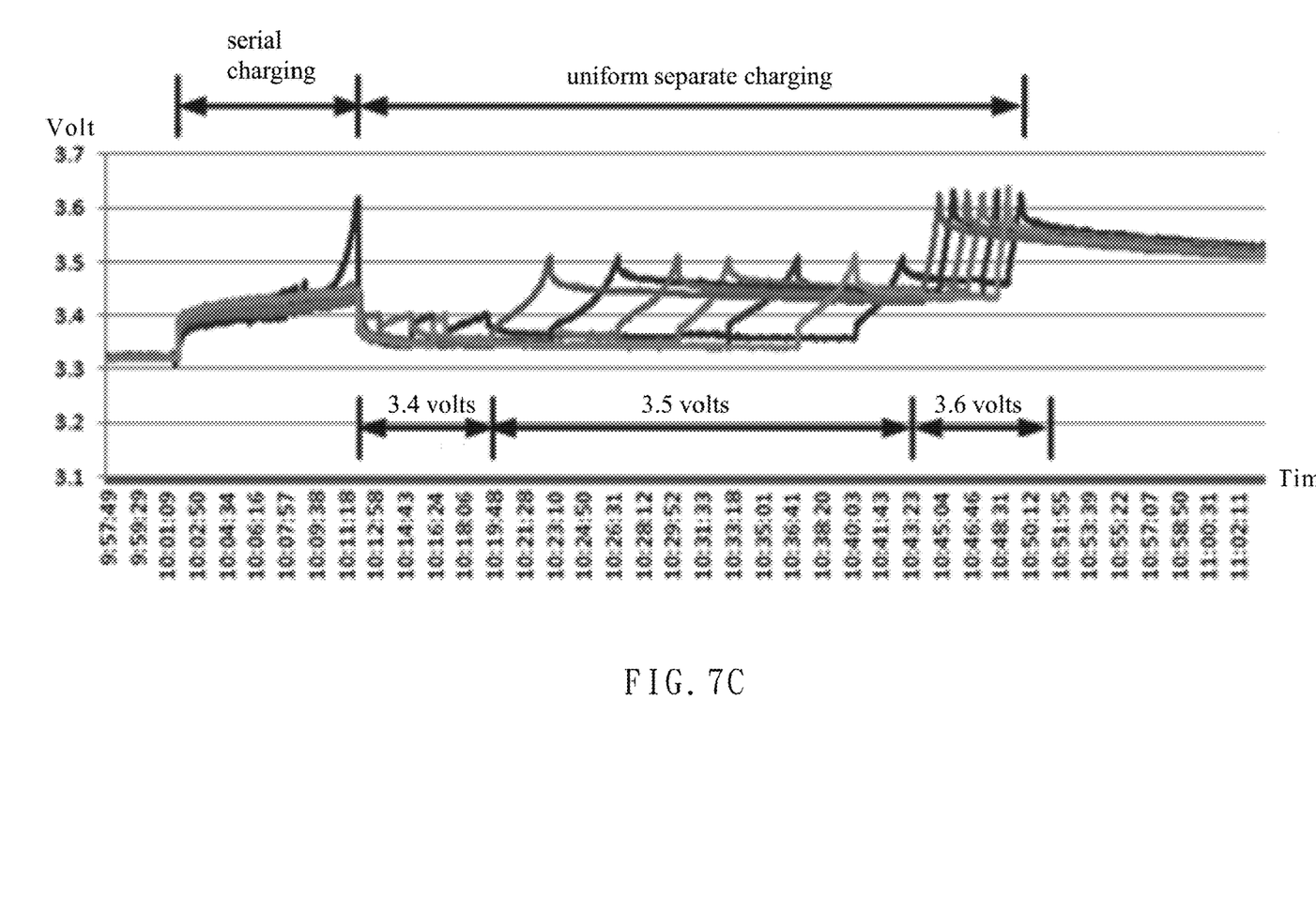
FIG. 7C is a curve diagram showing voltages of battery cells in a battery set when a charging method of the present disclosure is successfully performed on the battery set.

Referring to FIG. 7C, FIG. 7C is a curve diagram showing voltages of battery cells in a battery set when a charging method of the present disclosure is successfully performed on the battery set. The three segmented voltages of the three segmentations are 3.4, 3.5, and 3.6 volts respectively. That is, the battery cells are sequentially and separately charged to 3.4 volts in the first segmentation, the battery cells are sequentially and separately charged to 3.5 volts in the second segmentation, and the battery cells are sequentially and separately charged to 3.6 volts in the third segmentation. If the battery set should be used in the emergency condition, the charging method of the present disclosure will not be successfully performed, but the voltage difference between the successfully separately charge battery cell and the non-successfully separately charge battery cell is not large since the battery cells are sequentially and separately charged to the segmented voltage in each segmentation during the second stage charging.

The embodiments of the present disclosure provide a charging method for a battery set and a battery management system using the charging method, and the embodiment of the present disclosure have possible technical results as follows. The conventional charging method balances the battery cells after the two-stage charging has been finished, but the charging method according to the embodiment of the present disclosure separately charges the sorted battery cells to the segmented voltage in each segmentation, thus the battery cell with the minimum cell voltage is firstly balanced. Equivalently, all battery cells are charged to the saturation voltage in balance states. That is, the time period which the all battery cells enter the balance states by using the charging method according to the embodiment of the present disclosure is shorter than the time period which the all battery cells enter the balance states by using the conventional charging method.

Furthermore, in the second stage charging, the time period which the battery cell is separately charged by using the charging method according to the embodiment of the present disclosure is also shorter than the time period which the battery cell is separately charged by using the conventional charging method. Thus, the accumulated thermal energy can be reduced, and the additional time period which other battery cells are separately charged can be used to decrease the temperature rising of the battery cell, such that the temperature rising problem due to the longtime period charging on the battery cell can be solved.

Moreover, the conventional charging method should finish the two-stage charging to make the battery cells be balanced, and if the separate charging (i.e. second stage charging) has not been finished, all of the battery cells cannot reach the saturation voltage, and the voltage differences between the battery cells may be large. However, the charging method according to the embodiment of the present disclosure firstly separately charges the battery cell with the minimum cell voltage for an objective of balancing, and thus voltage differences between battery cells can be reduced, so as to make the cell voltages of the battery cells be approximately uniform (i.e. the battery cells are balanced).

While the present disclosure has been described by means of specific embodiments, numerous modifications and variations could be made thereto by those skilled in the art without departing from the scope and spirit of the present disclosure set forth in the claims.

What is claimed is:

1. A charging method for a battery set with a plurality of battery cells, comprising:
performing a serial charging on the battery cells;
determining whether one of the battery cells reaches a saturation voltage; and
performing a uniform separate charging on the battery cells when one of the battery cells reaches the saturation voltage, wherein the uniform separate charging comprises:
sorting the battery cells according to cell voltages of the battery cells; and
sequentially and separately charging the sorted battery cells to a $N^{th}$ segmented voltage in a $N^{th}$ segmentation, wherein N is a positive integer from 1 to K, and K is a positive integer larger than 1;
wherein the battery cell with a minimum cell voltage is firstly charged to the Nth segmented voltage in the Nth segmentation, then the battery cell with a sub minimum cell voltage is charged to the Nth segmented voltage in the Nth segmentation, and then, in this manner, the next battery cell with the cell voltage less than the Nth segmented voltage is charged to the Nth segmented voltage in the Nth segmentation.

2. The charging method for the battery set with the plurality of battery cells according to claim 1, wherein the uniform separate charging is finished when the sorted battery cells are sequentially and separately charged to the $K^{th}$ segmented voltage in the $K^{th}$ segmentation.

3. The charging method for the battery set with the plurality of battery cells according to claim 1, further comprising:
measuring a voltage difference between a maximum cell voltage and a minimum cell voltage among the battery cells; and
performing balancing of the serial charging when no battery cells reach the saturation voltage, wherein the balancing of the serial charging comprises:
separately charging the battery cell with the minimum cell voltage when the voltage difference is larger than a first threshold voltage, and stop separately charging when the voltage difference is reduced to less than a second threshold voltage, wherein the first threshold voltage is larger than the second threshold voltage.

4. The charging method for the battery set with the plurality of battery cells according to claim 3, wherein the first threshold voltage and the second threshold voltage are 50 and 30 millivolts.

5. The charging method for the battery set with the plurality of battery cells according to claim 3, wherein when the voltage difference is larger than the first threshold voltage and the minimum cell voltage is larger than a balancing set value, the battery cell with the minimum cell voltage is separately charged.

6. The charging method for the battery set with the plurality of battery cells according to claim 3, wherein balancing switches corresponding to the battery cell with the minimum cell voltage are turned on for separately charging.

7. The charging method for the battery set with the plurality of battery cells according to claim 1, wherein the battery cells are lithium iron phosphate (LFP) battery cells, K is 4, and the first through fourth segmented voltages are 3.3, 3.4, 3.5 and 3.6 volts.

8. The charging method for the battery set with the plurality of battery cells according to claim 1, wherein the battery cells are lithium ion (NMC) battery cells, K is 4, and the first through fourth segmented voltages are 3.9, 4.0, 4.1 and 4.2 volts.

9. The charging method for the battery set with the plurality of battery cells according to claim 1, wherein the serial charging comprises:
connecting the battery cells in a serial fashion; and
connecting a positive terminal of a first battery cell of the serially connected battery cells and a negative terminal of a last battery cell of the serially connected battery cells respectively to an anode terminal and a cathode of an external power source.

10. A battery management system for charging a battery set with a plurality of battery cells, comprising:
a controller;
a balancing power source, electrically connected to the controller; and
switch modules, connected to the battery cells, the controller and the balancing power source;
wherein the controller, the balancing power source and the switch modules cooperate to perform a charging method comprising:
performing a serial charging on the battery cells;
determining whether one of the battery cells reaches a saturation voltage; and
performing a uniform separate charging on the battery cells when one of the battery cells reaches the saturation voltage, wherein the uniform separate charging comprises:
sorting the battery cells according to cell voltages of the battery cells; and
sequentially and separately charging the sorted battery cells to a $N^{th}$ segmented voltage in a $N^{th}$ segmentation, wherein N is a positive integer from 1 to K, and K is a positive integer larger than 1;
wherein the battery cell with a minimum cell voltage is firstly charged to the Nth segmented voltage in the Nth segmentation, then the battery cell with a sub minimum cell voltage is charged to the Nth segmented voltage in the Nth segmentation, and then, in this manner, the next battery cell with the cell voltage less than the Nth segmented voltage is charged to the Nth segmented voltage in the Nth segmentation.

11. The battery management system for charging the battery set with the plurality of battery cells according to claim 10, wherein the uniform separate charging is finished when the sorted battery cells are sequentially and separately charged to the $K^{th}$ segmented voltage in the $K^{t}$ segmentation.

12. The battery management system for charging the battery set with the plurality of battery cells according to claim 10, wherein the charging method further comprises:
measuring a voltage difference between a maximum cell voltage and a minimum cell voltage among the battery cells; and
performing balancing of the serial charging when no battery cells reach the saturation voltage, wherein the balancing of the serial charging comprises:

separately charging the battery cell with the minimum cell voltage when the voltage difference is larger than a first threshold voltage, and stop separately charging when the voltage difference is reduced to less than a second threshold voltage, wherein the first threshold voltage is larger than the second threshold voltage.

13. The battery management system for charging the battery set with the plurality of battery cells according to claim 12, wherein the first threshold voltage and the second threshold voltage are 50 and 30 millivolts.

14. The battery management system for charging the battery set with the plurality of battery cells according to claim 12, wherein when the voltage difference is larger than the first threshold voltage and the minimum cell voltage is larger than a balancing set value, the battery cell with the minimum cell voltage is separately charged.

15. The battery management system for charging the battery set with the plurality of battery cells according to claim 12, wherein balancing switches corresponding to the battery cell with the minimum cell voltage are turned on for separately charging.

16. The battery management system for charging the battery set with the plurality of battery cells according to claim 10, wherein the battery cells are lithium iron phosphate (LFP) battery cells, K is 4, and the first through fourth segmented voltages are 3.3, 3.4, 3.5 and 3.6 volts.

17. The battery management system for charging the battery set with the plurality of battery cells according to claim 10, wherein the battery cells are lithium ion (NMC) battery cells, K is 4, and the first through fourth segmented voltages are 3.9, 4.0, 4.1 and 4.2 volts.

18. The battery management system for charging the battery set with the plurality of battery cells according to claim 10, wherein the serial charging comprises:

connecting the battery cells in a serial fashion; and connecting a positive terminal of a first battery cell of the serially connected battery cells and a negative terminal of a last battery cell of the serially connected battery cells respectively to an anode terminal and a cathode of an external power source.

* * * * *